(12) United States Patent
Okamoto et al.

(10) Patent No.: US 8,492,784 B2
(45) Date of Patent: Jul. 23, 2013

(54) SEMICONDUCTOR DEVICE AND METHOD FOR PRODUCING THE SAME, AND POWER SUPPLY

(75) Inventors: Keishiro Okamoto, Kawasaki (JP); Tadahiro Imada, Kawasaki (JP); Nobuhiro Imaizumi, Kawasaki (JP); Keiji Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 30 days.

(21) Appl. No.: 13/331,090

(22) Filed: Dec. 20, 2011

(65) Prior Publication Data

US 2012/0199991 A1    Aug. 9, 2012

(30) Foreign Application Priority Data

Feb. 9, 2011  (JP) .................................... 2011-26232

(51) Int. Cl.
*H01L 33/00* (2010.01)
(52) U.S. Cl.
USPC ................... 257/98; 257/76; 257/79; 257/80; 257/83; 257/84; 438/22; 438/27; 438/46; 438/98; 438/118

(58) Field of Classification Search
None
See application file for complete search history.

(56) References Cited

U.S. PATENT DOCUMENTS

2009/0224277 A1*  9/2009  Leung et al. ................... 257/98

FOREIGN PATENT DOCUMENTS

| JP | 5-315474 | 11/1993 |
| JP | 10-209344 | 8/1998 |

* cited by examiner

*Primary Examiner* — Kyoung Lee
(74) *Attorney, Agent, or Firm* — Kratz, Quintos & Hanson, LLP (57) ABSTRACT

A semiconductor device includes: a semiconductor chip including a nitride semiconductor layered structure including a carrier transit layer and a carrier supply layer; a first resin layer on the semiconductor chip, the first resin layer including a coupling agent; a second resin layer on the first resin layer, the second resin layer including a surfactant; and a sealing resin layer to seal the semiconductor chip with the first resin layer and the second resin layer.

20 Claims, 6 Drawing Sheets

SEMICONDUCTOR DEVICE AND METHOD FOR PRODUCING THE SAME, AND POWER SUPPLY

CROSS-REFERENCE TO RELATED APPLICATIONS

This application claims the benefit of priority from Japanese Patent Application No. 2011-26232 filed on Feb. 9, 2011, the entire contents of which are incorporated herein by reference.

BACKGROUND

1. Field

The embodiment relates to a semiconductor device, a method for fabricating the semiconductor device and a power supply.

2. Description of Related Art

A high electron mobility transistor (HEMT) includes a semiconductor layered structure including a carrier transit layer and a carrier supply layer. There is provided a GaN-HEMT that uses a heterojunction of AlGaN/GaN, which is a GaN-based compound semiconductor. The GaN-HEMT has a HEMT structure in which a GaN layer serving as an electron transit layer and an AlGaN layer serving as an electron supply layer are stacked.

The related art is disclosed in Japanese Unexamined Patent Application Publication Nos. 5-315474 and 10-209344.

SUMMARY

According to one aspect of the embodiments, a semiconductor device includes: a semiconductor chip including a nitride semiconductor layered structure including a carrier transit layer and a carrier supply layer; a first resin layer on the semiconductor chip, the first resin layer including a coupling agent; a second resin layer on the first resin layer, the second resin layer including a surfactant; and a sealing resin layer to seal the semiconductor chip with the first resin layer and the second resin layer.

Additional advantages and novel features of the invention will be set forth in part in the description that follows, and, in part, will become more apparent to those skilled in the art upon examination of the following or upon learning by practice of the invention.

BRIEF DESCRIPTION OF THE DRAWINGS

Each of FIGS. 1A and 1B illustrates an exemplary surface of a semiconductor chip.

DESCRIPTION OF EMBODIMENTS

The band gap of GaN may be larger than the band gap (about 1.1 eV) of Si and the band gap (about 1.4 eV) of GaAs, and may be, for example, about 3.4 eV. GaN has a high breakdown field strength and a high saturated electron velocity. GaN may be applied to semiconductor devices for power supplies that are operated at high voltage and have high output. For example, GaN-HEMTs may be applied to high-efficiency switching elements for power supplies and power devices with high breakdown voltage used for electric vehicles.

In GaN-HEMTs, to improve the moisture resistance and breakdown voltage, the surface of a semiconductor chip may be covered with a resin having a breakdown voltage higher than that of a sealing resin before the resin sealing of an epoxy resin or the like.

Figure 1A:
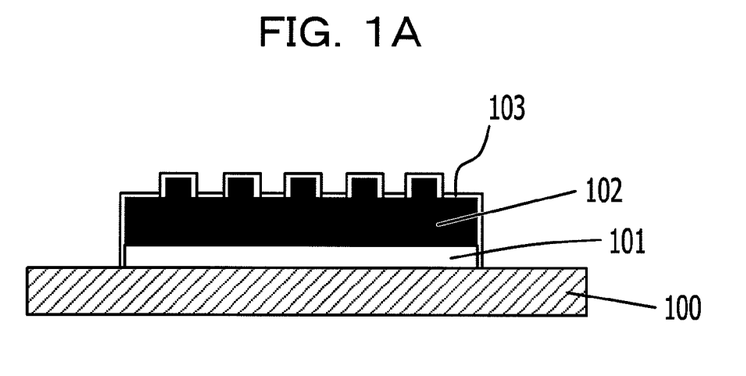
Figure 1B:
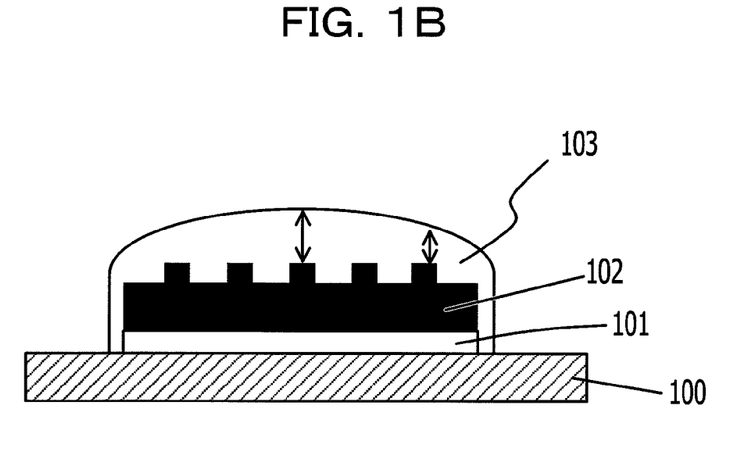

Each of FIGS. 1A and 1B illustrates an exemplary surface of a semiconductor chip. The surface of a semiconductor chip including electrodes and wiring lines formed thereon is not flat and may have depressions and projections (steps). A source electrode, a drain electrode, and a gate electrode of a transistor are formed on the surface illustrated in FIG. 1A. For example, when a semiconductor chip 102 is fixed on a supporting plate 100 (such as, a lead frame or a substrate using a die attaching agent 101 (die bonding agent)) and the surface of the semiconductor chip 102 is covered with a resin layer 103 before the resin sealing, the thickness of the resin layer 103 at the corners of projections may be decreased. Since high voltage is locally applied to the thin portion, sufficient breakdown voltage may not be provided.

For example, as illustrated in FIG. 1B, a thick resin layer may be formed on the entire surface of the semiconductor chip 102 to increase the thickness of the resin layer 103 at the corners of projections on the surface of the semiconductor chip 102. Since the thickness of the resin layer 103 in the central portion of the semiconductor chip 102 is different from that in the peripheral portion of the semiconductor chip 102, different stresses may be applied on the surface of the semiconductor chip 102.

Figure 2:
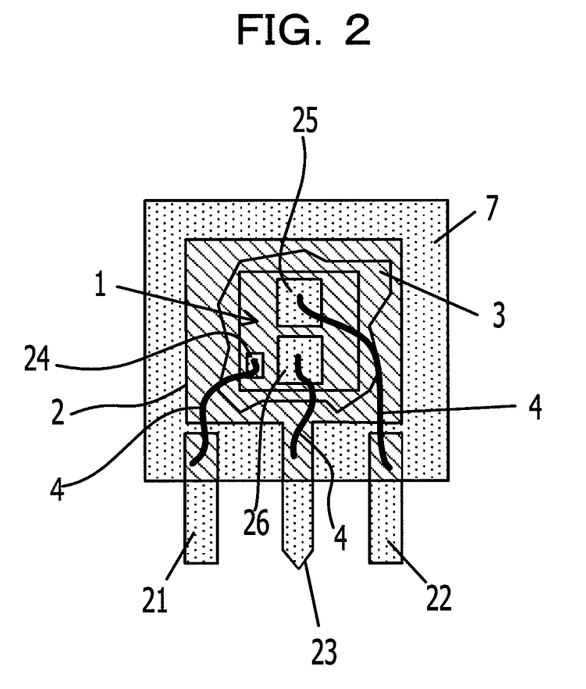
FIG. 2 illustrates an exemplary semiconductor device.

FIG. 2 illustrates an exemplary semiconductor device. The semiconductor device includes a semiconductor chip 1, a stage 2 on which the semiconductor chip 1 is mounted, a gate lead 21, a source lead 22, a drain lead 23, bonding wires 4 (Al wires), and a sealing resin layer 7. The sealing resin layer 7 may be a molded resin. The semiconductor device may be a compound semiconductor device including a nitride-based (e.g., GaN-based) compound semiconductor. The semiconductor device may be a semiconductor package in which a semiconductor chip having a nitride semiconductor layered structure including a carrier transit layer; and a carrier supply layer is resin-sealed. The semiconductor chip 1 is mounted on the stage 2, and may be fixed using, for example, a die attaching agent 3 (such as, solder). The semiconductor chip may also be referred to as a semiconductor element.

A gate pad 24, a source pad 25, and a drain pad 26 of the semiconductor chip 1 mounted on the stage 2 are respectively coupled to the gate lead 21, the source lead 22, and the drain lead 23 through Al wires 4, and they are sealed with the sealing resin layer 7. The stage 2 on which the back of the substrate of the semiconductor chip 1 is fixed using the die attaching agent 3 is electrically coupled to the drain lead 23. The stage 2 may be electrically coupled to the source lead 22.

Figure 3:
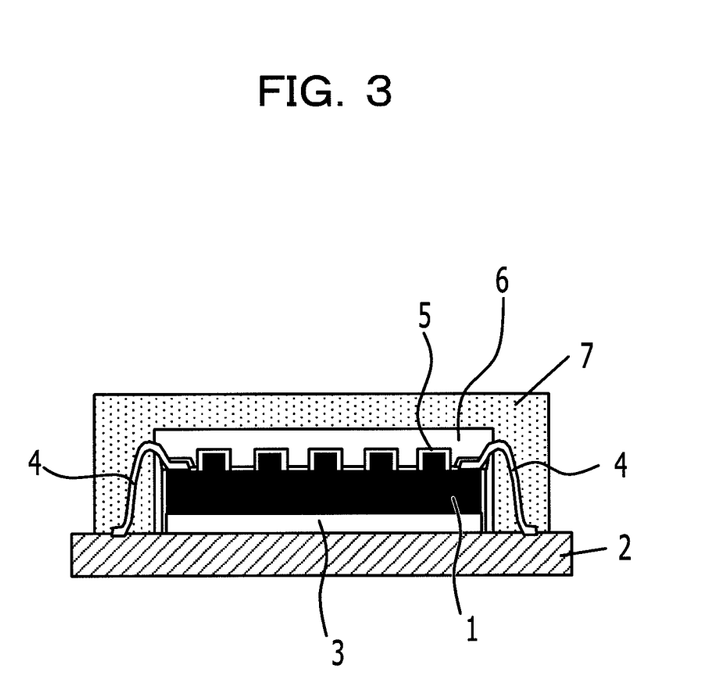
FIG. 3 illustrates an exemplary semiconductor device.

FIG. 3 illustrates an exemplary semiconductor device. The semiconductor device illustrated in FIG. 3 may be one configuration of the semiconductor device illustrated in FIG. 2. The semiconductor chip 1 may include a GaN-HEMT having a GaN-based semiconductor layered structure including a GaN electron transit layer and an AlGaN electron supply layer. For example, the semiconductor chip 1 may include a GaN-HEMT chip for power supplies that is used for a switching element included in an electronic apparatus or a power supply. The GaN-HEMT chip 1 includes a gate electrode, a source electrode, and a drain electrode disposed on the GaN-based semiconductor layered structure; and a wiring layer including an insulating film and wiring lines disposed on the electrodes. Since electrodes or wiring lines are formed on the surface side of the GaN-HEMT chip 1, the surface may not be flat. For example, as illustrated in FIG. 3, the surface may have depressions and projections. FIG. 3 illustrates the depressions and projections of the surface above the source electrode, drain electrode, and gate electrode of a transistor. The surface of the GaN-HEMT chip 1 is covered with an insulating film, and the gate pad 24, the source pad 25, and the drain pad 26 may be exposed. The GaN-HEMT may be referred to as a GaN-based HEMT. The GaN-HEMT chip may be referred to as a GaN-based HEMT chip.

The insulating film formed on the surface of the semiconductor chip 1 may include an inorganic insulating film or an organic insulating film. For example, the inorganic insulating film may be an insulating film including at least one material of silicon oxide (SiO), silicon nitride (SiN), titanium oxide (TiO, for example, $TiO_2$), aluminum oxide (AlO, for example, $Al_2O_3$), and amorphous silicon (a-Si). The organic insulating film may be an insulating film including at least one material of polyimide, fluorine-added silicon oxide (SiOF), carbon-added silicon oxide (SiOC), fluorine-added carbon (CF), and methyl-containing polysiloxane (methyl silsesquioxane (MSQ)). The inorganic insulating film may be referred to as an inorganic film. The organic insulating film may be referred to as an organic film. The insulating film may be referred to as an interlayer insulating film.

For example, when the semiconductor chip is used for a high-efficiency switching element or a high breakdown voltage power device, the sealing of the semiconductor chip 1 with the sealing resin layer 7 (such as, an inorganic filler-containing epoxy resin or the like) may not provide sufficient moisture resistance and breakdown voltage. As illustrated in FIG. 3, the surface of the semiconductor chip 1 is covered with a first resin layer 5 including a coupling agent. The surface of the first resin layer 5 is covered with a second resin layer 6 including a surfactant. The semiconductor chip 1 covered with the first resin layer 5 and second resin layer 6 is sealed with the sealing resin layer 7. Before resin sealing, the surface of the semiconductor chip 1 is covered with the first resin layer 5 and second resin layer 6 having a breakdown voltage higher than that of the sealing resin layer 7 (e.g., the first resin layer 5 including a coupling agent and the second resin layer 6 including a surfactant). The surface of the semiconductor chip 1 is covered with a resin layer having a three-layer structure in which the first resin layer 5, the second resin layer 6, and the sealing resin layer 7 are stacked in that order.

The first resin layer 5 and the second resin layer 6 may each be referred to as a junction coating resin (JCR) layer. The first resin layer 5, the second resin layer 6, and the sealing resin layer 7 may each be referred to as a surface protective layer. The resin sealing package structure illustrated in FIG. 3 may reduce the degradation of device characteristics and provide high moisture resistance and breakdown voltage.

Since the first resin layer 5 includes a coupling agent, the adhesion strength between the insulating film formed on the surface of the semiconductor chip 1 and the second resin layer 6 is increased. Thus, the adhesion and moisture resistance are improved. When the first resin layer 5 that covers the surface of the semiconductor chip 1 having depressions and projections has a thin portion, sufficient withstand voltage may be provided since the first resin layer 5 is covered with the second resin layer 6 having a breakdown voltage higher than that of the sealing resin layer 7. When the surface of the semiconductor chip 1 having depressions and projections is covered with the first resin layer 5 and resin-sealed, the thickness of the first resin layer 5 at the corners of projections may be decreased. When high voltage is applied to the thin portion, sufficient breakdown voltage may not be completely provided because the breakdown voltage of the sealing resin is small. Since the surface of the semiconductor chip 1 having depressions and projections is covered with the first resin layer 5 and the second-resin layer 6 having a breakdown voltage higher than that of the sealing resin layer 7, sufficient withstand voltage may be provided. The second resin layer 6 may be formed so that all depressions and projections, in their entireties, of the surface of the semiconductor chip 1 are embedded with the second resin layer 6. The thickness of the second resin layer 6 at the corners of projections is not decreased; and thus, high voltage may be applied. The withstand voltage may be increased.

Since the second resin layer 6 includes a surfactant, the surface tension of the second resin layer 6 is decreased. Therefore, the depressions and projections of the surface of the semiconductor chip 1 are embedded with the second resin layer 6; and the surface may become flat. The bonding interface between the second resin layer 6 and the sealing resin layer 7 may be flatter than the bonding interface between the first resin layer 5 and the second resin layer 6. The flatness of the bonding interface between the second resin layer 6 and the sealing resin layer 7 may be larger than that of the bonding interface between the first resin layer 5 and the second resin layer 6. Since the thicknesses of the resin layers 5 and 6 formed on the surface of the semiconductor chip 1 do not change depending on the position between the central portion and peripheral portion of the semiconductor chip 1, portions having different residual stresses generated during the curing of resins may not occur. Since different stresses are not applied to the semiconductor chip from the resin layers 5 and 6, the transistor characteristics may not vary depending on the position between the central portion and peripheral portion of the semiconductor chip 1; and thus, the device characteristics may not be degraded.

Two resin layers may be formed between the semiconductor chip 1 and the sealing resin layer 7. Since the first resin layer 5, which is one of the two layers, includes a coupling agent, the adhesion and moisture resistance may be provided. Since the second resin layer 6, which is the other of the two layers, includes a surfactant, the degradation of device characteristics may be reduced while high breakdown voltage is provided. The first resin layer 5 and the second resin layer 6 may have substantially the same resin component or a similar resin component. For example, when the first resin layer 5 includes a polyimide resin, the second resin layer 6 may include a polyimide resin. This may improve the adhesion between the first resin layer 5 and the second resin layer 6. Since the stress applied between the first resin layer 5 and the second resin layer 6 may reduce, the adhesion between the insulating film formed on the surface of the semiconductor chip 1 and the first resin layer 5 and between the first resin layer 5 and the second resin layer 6 may be improved.

For example, the first resin layer 5 may include a polyimide resin, a polyamide resin, or a silicone resin. The first resin layer 5 may be a resin layer including a polyimide resin containing a coupling agent, a polyamide resin containing a coupling agent, or a silicone resin containing a coupling agent. The first resin layer 5 may be a resin layer including at least one of a polyimide resin containing a coupling agent, a polyamide resin containing a coupling agent, and a silicone resin containing a coupling agent. For example, the first resin layer 5 may be a resin layer obtained by mixing any of the above-described resins.

Examples of the coupling agent include a silane coupling agent, a titanium coupling agent, a zirconium coupling agent, and an aluminum coupling agent. The coupling agent may have, as an organic functional group, at least one of a vinyl group, an epoxy group, a nitro group, a methacrylic group, an amino group, a mercapto group, an isocyanato group, a carboxyl group, and a hydroxyl group. The coupling agent may have, as a hydrolyzable group, at least one of a chloro group, an alkoxy group, an acetoxy group, an isopropenoxy group, and an amino group. The coupling agent may have these organic functional groups and hydrolyzable groups.

For example, the silane coupling agent may include 3-mercaptopropyltrimethoxysilane. The silane coupling agent may include vinyltrichlorosilane, vinylmethoxysilane, vinyltris(2-methmethoxy)silane, vinyltriethoxysilane, vinyltrimethoxysilane, 3-(methacryloxypropyl)trimethoxysilane, 2-(3,4-epoxycyclohexyl)-3-glycidoxypropyl-3-methyldiethoxysilane, N-2-(aminoethyl)-3-aminopropyltrimethoxysilane, N-2-(aminoethyl)-3-aminopropylmethyldimethoxysilane, 3-aminopropyltrimethoxysilane, 3-aminopropyltriethoxysilane, N-phenyl-3-aminopropyltrimethoxysilane, or 3-chloropropyltrimethoxysilane.

The titanium coupling agent, zirconium coupling agent, and aluminum coupling agent may be obtained by replacing silane in the above-described silane coupling agents with titanium, zirconium, and aluminum, respectively. The first resin layer 5 may include a material containing a coupling agent in an amount of 10 wt % or less. Since a reduction in the strength of the first resin layer 5 due to decreasing the resin content of the first resin layer 5 may be reduced, the adhesion between the insulating film formed on the surface of the semiconductor chip 1 and the first resin layer 5 and between the first resin layer 5 and the second resin layer 6 may be improved.

The second resin layer 6 may include a polyimide resin, a polyamide resin, or a silicone resin. The second resin layer 6 may include a polyimide resin containing a surfactant, a polyamide resin containing a surfactant, or a silicone resin containing a surfactant. The second resin layer 6 may include at least one of a polyimide resin containing a surfactant, a polyamide resin containing a surfactant, and a silicone resin containing a surfactant. The second resin layer 6 may be a resin layer obtained by mixing any of the above-described resins.

Examples of the surfactant include fluorinated surfactants, hydrocarbon surfactants, and silicone surfactants. The surfactant may include a fluorinated surfactant. Examples of the fluorinated surfactant include perfluorooctanoic acid (PFOA), perfluorosulfonic acid (PFOS), long-chain perfluorocarboxylic acids (PFCAs) having a larger number of carbon atoms than PFOA, perfluorobutanesulfonic acid (PFBS), and perfluorohexanoic acid (PFHXA).

The second resin layer 6 may include a material containing a surfactant in an amount of 1 ppm or more and 5000 ppm or less. A reduction in the strength of the second resin layer 6 due to a decrease of the resin content of the second resin layer 6 may be reduced. The flatness of the surface of the second resin layer 6 may be improved without decreasing the adhesion between the first resin layer 5 and the second resin layer 6 and between the second resin layer 6 and the sealing resin layer 7. The sealing resin layer 7 may include an epoxy resin or a silicone resin. The sealing resin layer 7 may include one of an epoxy resin and a silicone resin. The sealing resin layer 7 may include at least one of an epoxy resin and a silicone resin. For example, the sealing resin layer 7 may be a resin layer obtained by mixing any of the above-described resins.

The sealing resin layer 7 may include inorganic particles. The thermal conductivity of the entire resin package that seals the semiconductor chip 1 may be improved. For example, the inorganic particles may include silica, alumina, magnesia, or zirconia. The inorganic particles may be glass particles, various ceramic particles, or fiberglass reinforced plastic (FRP) particles. Such particles may have any shape. Such particles may be spherical particles, granular particles, massive particles, fragment-like particles, porous particles, aggregate particles, flake-like particles, spiky particles, filament-like particles, fibrous particles, or whisker-like particles. The inorganic particles may be referred to as an inorganic filler. The first resin layer 5 and the second resin layer 6 may not include the inorganic particles. Inorganic particles located near the semiconductor chip 1 may cause damage to the semiconductor chip 1.

The sealing resin layer 7 may include a coupling agent. The adhesion between the second resin layer 6 and the sealing resin layer 7 may be improved. Any combination may be employed regarding the materials for the first resin layer 5, second resin layer 6, and sealing resin layer 7. For example, the first resin layer 5 and the second resin layer 6 may include a polyamide resin, the surfactant may include a fluorinated surfactant; and the sealing resin layer 7 may include an ortho-cresol novolac (OCN)-based or multi-aromatic resin (MAR)-based epoxy resin. The moisture resistance and breakdown voltage may be improved.

Figure 4A:
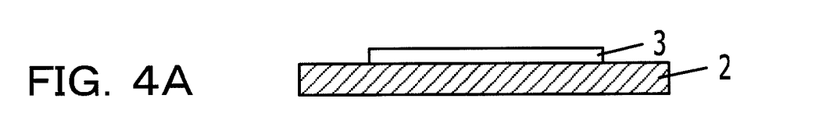
FIGS. 4A to 4F illustrate an exemplary method for fabricating a semiconductor device.
Figure 4B:
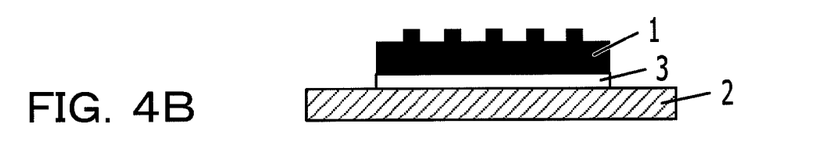

FIGS. 4A to 4F illustrate an exemplary method for fabricating a semiconductor device. The semiconductor device may be a discrete package. As illustrated in FIGS. 4A and 4B, a semiconductor chip 1 having a nitride semiconductor layered structure including a carrier transit layer and a carrier supply layer is disposed on a stage 2 of a lead frame using a die attaching agent 3 (such as, solder).

Although not illustrated in the drawings, a metal film where Ti, Ni, and Au are stacked in that order, for example, an adhesion layer may be formed on the back of the semiconductor chip 1 by performing sputtering, vapor deposition, plating, or the like. As illustrated in FIG. 4A, a die attaching agent 3 (such as, Ag paste or solder paste) is supplied to a region where a semiconductor chip 1 is to be mounted on a stage 2 of a lead frame, by performing dispensing, printing, transferring, or the like.

As illustrated in FIG. 4B, the semiconductor chip 1 mounted on the stage 2 so as to face upward is heated in a conveyor-type reflow furnace or the like at about 180° C. for about 10 minutes. The semiconductor chip 1 is attached onto the stage 2 of the lead frame through the die attaching agent 3, and thus the semiconductor chip 1 is disposed on the stage 2 of the lead frame. This operation may be included in a die bonding operation.

Figure 4C:
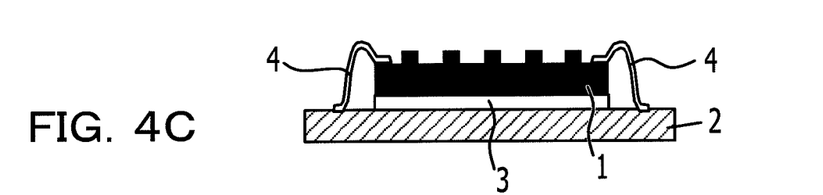

As illustrated in FIG. 4C, a gate pad 24 of the semiconductor chip 1 is coupled to a gate lead 21, a drain pad 26 is coupled to a drain lead 23, and a source pad 25 is coupled to a source lead 22 by bonding that uses wires 4 (such as, Al wires). The pads 24 to 26 of the semiconductor chip 1 are electrically coupled to the leads 21 to 23 of the lead frame, respectively. This operation may be included in a wire bonding operation.

Figure 4D:
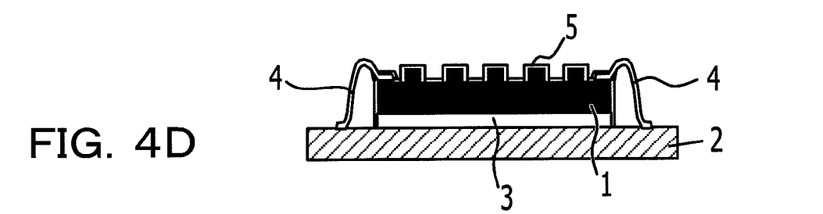

As illustrated in FIG. 4D, a first resin layer 5 including a coupling agent is formed so as to cover the surface of the semiconductor chip 1. This operation may be included in a first resin layer formation operation. For example, a polyimide resin varnish including a silane coupling agent is applied onto the surface of the semiconductor chip 1 that has been subjected to wire bonding, by performing spraying, dispensing, or the like. Subsequently, the polyimide resin is cured by heating. Thus, a first resin layer 5 including a coupling agent is formed on the surface of the semiconductor chip 1.

The resin material that includes a coupling agent and that has been applied onto the surface of the semiconductor chip 1 is cured. For example, a coupling agent is applied in advance onto the surface of the semiconductor chip 1 (such as an insulating film); a resin material is applied onto the coupling agent; and the resin material may be cured. The resin material may or may not include a coupling agent. The first resin layer 5 includes a coupling agent.

Figure 4E:
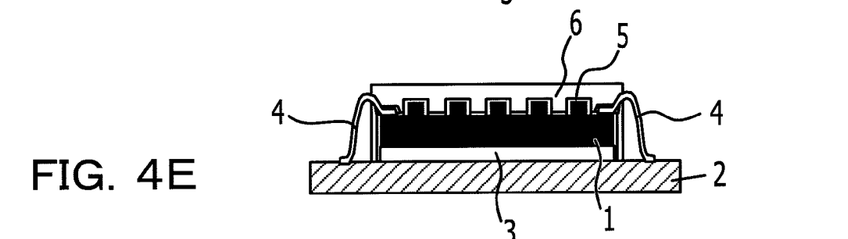

As illustrated in FIG. 4E, a second resin layer 6 including a surfactant is formed so as to cover the surface of the first resin layer 5. This operation may be included in a second resin layer formation operation. For example, a polyimide resin varnish including a fluorinated surfactant is applied onto the first resin layer 5 that covers the semiconductor chip 1 by performing spraying, dispensing, or the like; and then, the polyimide resin is cured by heating to form a second resin layer 6 including a surfactant.

Figure 4F:
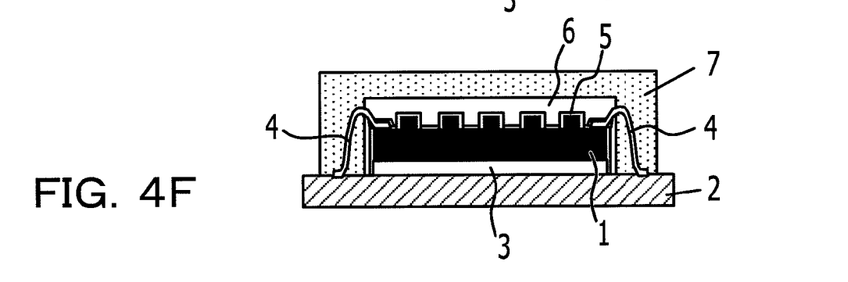

As illustrated in FIG. 4F, a sealing resin layer 7 is formed that seals the semiconductor chip 1 covered with the first resin layer 5 and the second resin layer 6. This operation may be included in a resin sealing operation. For example, the fabricated body including the lead frame having the stage 2, the semiconductor chip 1 covered with the first resin layer 5 and second resin layer 6, and the wires 4 that couple the lead frame and the semiconductor chip 1 to each other is set in a mold of a resin sealing apparatus. The fabricated body is sealed using a thermosetting alumina filler-containing epoxy resin by transfer molding or the like. An alumina filler-including epoxy resin layer is formed as the sealing resin layer 7 that seals the semiconductor chip 1 covered with the first resin layer 5 and second resin layer 6. The resin sealing apparatus may be included in a molding apparatus.

To improve the adhesion between the second resin layer 6 and the sealing resin layer 7, a sealing resin material including a coupling agent may be used as a sealing resin material for the sealing resin layer 7. The sealing resin layer 7 may include a coupling agent. After a coupling agent is applied onto the surface of the second resin layer 6 that covers the semiconductor chip 1 prior to the resin sealing, the semiconductor chip 1 may be sealed with a sealing resin material. The sealing resin material may or may not include a coupling agent a coupling agent. The sealing resin layer 7 includes a coupling agent.

The resin-sealed fabricated body is released from the mold of the resin sealing apparatus, and is separated into individual bodies by being cut off from the lead frame through an outer lead cutting operation (not illustrated) or the like. Thus, a desired semiconductor device (for example, a discrete package) is obtained. The moisture resistance and breakdown voltage are provided and the degradation of device characteristics is reduced.

The breakdown voltage of the entire package measured during the operation of the semiconductor chip may be 1200 V or more. The breakdown voltage measured after a high temperature and humidity test (temperature-cycling test) at 85° C./85% RH for 1000 hours may be 1200 V or more. On the sections of the semiconductor chip, a first resin layer, a second resin layer and a sealing resin layer after each of the measurements, the sections being analyzed with a scanning electron microscope (SEM), the number of cracks or broken portions may be decreased, and the initial state may be maintained.

The breakdown voltage of the entire package measured during the operation of a semiconductor device that uses a single layer polyimide resin instead of the first and second resin layers may be about 600 V. The breakdown voltage measured after a high temperature and humidity test at 85° C./85% RH for 1000 hours may be 100 V or less. The sections of the semiconductor chip, a resin layer and a sealing resin layer after each of the measurements, the sections being analyzed with a SEM, may include cracks.

Figure 5A:
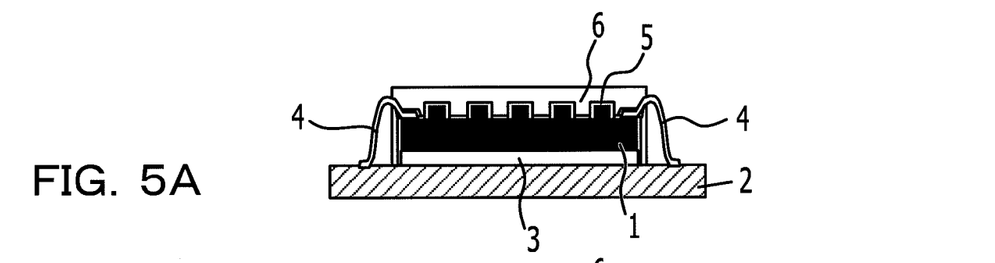
FIGS. 5A to 5C illustrate an exemplary method for fabricating a semiconductor device.
Figure 5B:
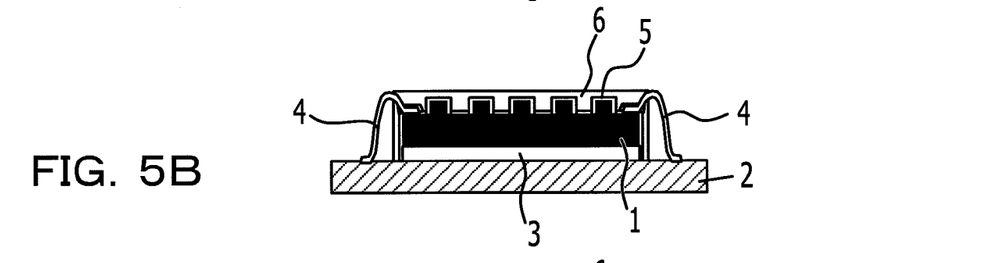
Figure 5C:
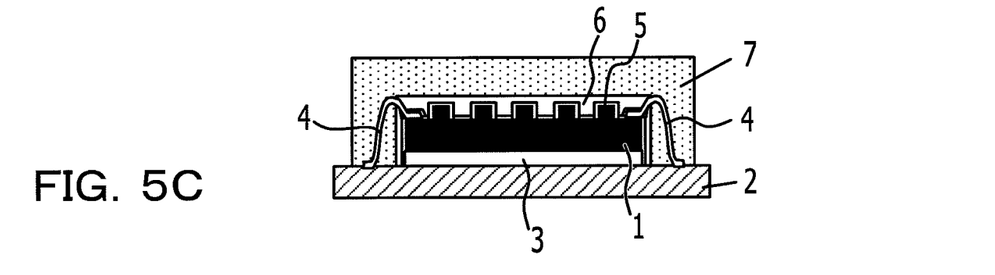

A semiconductor device with high reliability, in which the moisture resistance, breakdown voltage, and heat dissipation characteristics are provided and the degradation of characteristics is reduced, is provided with high yield. FIGS. 5A to 5C illustrate an exemplary method for fabricating a semiconductor device. As illustrated in FIGS. 5A to 5C, a leveling treatment may be performed on the second resin layer 6 between an operation after forming the second resin layer 6 and before sealing with the sealing resin layer 7. The thickness of the second resin layer 6 may decrease. The leveling treatment for the second resin layer 6 may be performed by a chemical or physical method (such as chemical mechanical polishing (CMP), etching, or milling). The stress applied to the semiconductor chip 1 (such as, residual stress generated during the curing of resins) is reduced; and the degradation of device characteristics may be reduced. For example, the stress applied to each of the transistors included in the semiconductor chip 1 is reduced, and the degradation of the characteristics of the transistors may be reduced.

Instead of the discrete package, another semiconductor package may be fabricated. Since the semiconductor device is produced using a lead frame, the semiconductor device includes the semiconductor chip 1 disposed on the stage 2 of the lead frame. For example, a semiconductor device including a semiconductor chip disposed on a package substrate may be produced. The supporting plate may include a stage of a lead frame or a package substrate.

For example, a semiconductor device including a semiconductor chip disposed on a circuit board may be produced. The supporting plate may include a circuit board.

Figure 6:
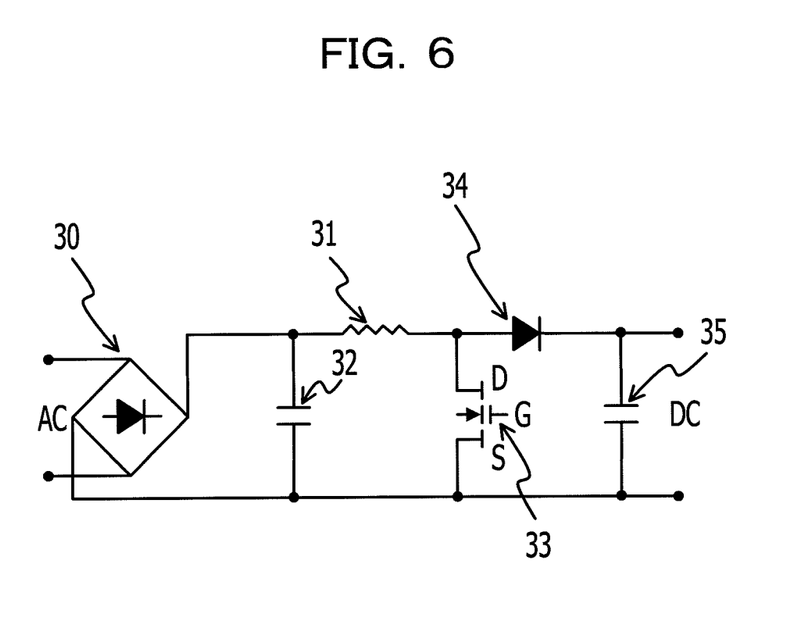
FIG. 6 illustrates an exemplary power supply.

FIG. 6 illustrates an exemplary power supply. The power supply illustrated in FIG. 6 may include a semiconductor package including a GaN-HEMT. For example, the GaN-HEMT included in the semiconductor package may be employed as a power factor correction (PFC) circuit included in a power supply used for servers.

As illustrated in FIG. 6, the PFC circuit includes a diode bridge 30, a choke coil 31, a first capacitor 32, a GaN-HEMT 33 included in the semiconductor package, a diode 34, and a second capacitor 35. In the PFC circuit, a diode bridge 30, a choke coil 31, a first capacitor 32, a GaN-HEMT 33 included in the above-described semiconductor package, a diode 34, and a second capacitor 35 are mounted on a circuit board.

The drain lead 23, source lead 22, and gate lead 21 of the semiconductor package are respectively inserted into a drain lead insertion site, a source lead insertion site, and a gate lead insertion site of the circuit board, and are each fixed using solder or the like. The GaN-HEMT 33 included in the semiconductor package may be coupled to the PFC circuit formed on the circuit board.

In the PFC circuit, one terminal of the choke coil 31 and the anode terminal of the diode 34 are coupled to the drain electrode D of the GaN-HEMT 33. One terminal of the first capacitor 32 is coupled to the other terminal of the choke coil 31; and one terminal of the second capacitor 35 is coupled to the cathode terminal of the diode 34. The other terminal of the first capacitor 32, the source electrode S of the GaN-HEMT 33, and the other terminal of the second capacitor 35 are grounded. A pair of terminals of the diode bridge 30 are coupled to both terminals of the first capacitor 32. The other pair of terminals of the diode bridge 30 are coupled to the input terminal from which an alternating-current (AC) voltage is input. Both terminals of the second capacitor 35 are coupled to the output terminal from which a direct-current (DC) voltage is output. A gate driver (not illustrated) is coupled to the gate electrode G of the GaN-HEMT 33. In the PFC circuit, the gate driver drives the GaN-HEMT 33, an AC voltage at the input terminal is converted to a DC voltage, and the DC voltage is output from the output terminal.

Since a semiconductor chip with high reliability is used, a power supply with high reliability is provided. The semiconductor device (such as, a GaN-HEMT or a semiconductor package including a GaN-HEMT) is used for a PFC circuit included in a power supply used for servers. The semiconductor device (such as, a GaN-HEMT or a semiconductor package including a GaN-HEMT) may be used for electronic apparatuses such as computers other than servers (for example, electronic devices). The semiconductor device (such as a semiconductor package) may be used for other circuits included in a power supply (such as, a DC-DC converter).

Example embodiments of the present invention have now been described in accordance with the above advantages. It will be appreciated that these examples are merely illustrative of the invention. Many variations and modifications will be apparent to those skilled in the art.

The invention claimed is:

1. A semiconductor device, comprising:
 a semiconductor chip including a nitride semiconductor layered structure including a carrier transit layer and a carrier supply layer;
 a first resin layer on the semiconductor chip, the first resin layer including a coupling agent;
 a second resin layer on the first resin layer, the second resin layer including a surfactant; and
 a sealing resin layer to seal the semiconductor chip with the first resin layer and the second resin layer.

2. The semiconductor device according to claim 1, wherein the first resin layer and the second resin layer have substantially the same resin component.

3. The semiconductor device according to claim 1, wherein the sealing resin layer includes a coupling agent.

4. The semiconductor device according to claim 1, wherein the content of the coupling agent is at most 10 wt %.

5. The semiconductor device according to claim 1, wherein the content of the surfactant is at least 1 ppm and at most 5000 ppm.

6. The semiconductor device according to claim 1, wherein the first resin layer includes at least one selected from a group consisting of a polyimide resin, a polyamide resin, and a silicone resin.

7. The semiconductor device according to claim 1, wherein the second resin layer includes at least one selected from a group consisting of a polyimide resin, a polyamide resin, and a silicone resin.

8. The semiconductor device according to claim 1, wherein the sealing resin layer includes at least one selected from a group consisting of an epoxy resin and a silicone resin.

9. The semiconductor device according to claim 1, wherein the sealing resin layer includes inorganic particles.

10. The semiconductor device according to claim 1, wherein a bonding interface between the second resin layer and the sealing resin layer is flatter than a bonding interface between the first resin layer and the second resin layer.

11. A power supply, comprising:
 a semiconductor chip including a nitride semiconductor layered structure including a carrier transit layer and a carrier supply layer;
 a first resin layer on a surface of the semiconductor chip, the first resin including a coupling agent;
 a second resin layer on the first resin layer, the second resin layer including a surfactant, and a sealing resin layer to seal the semiconductor chip with the first resin layer and the second resin layer.

12. A method for producing a semiconductor device, comprising:
 forming a first resin layer including a coupling agent on a semiconductor chip, the semiconductor chip including a nitride semiconductor layered structure having a carrier transit layer and a carrier supply layer;
 forming a second resin layer including a surfactant on the first resin layer; and
 forming a sealing resin layer to seal the semiconductor chip on which the first resin layer and the second resin layer are formed.

13. The method according to claim 12, further comprising: reducing the thickness of the second resin layer.

14. The method according to claim 12, further comprising: applying a first resin material including the coupling agent on the semiconductor chip; and
 curing the first resin material.

15. The method according to claim 12, further comprising: applying the coupling agent on the semiconductor chip; and
 applying a first resin material on the coupling agent; and
 curing the first resin material.

16. The method according to claim 12, further comprising the step of:
 sealing the semiconductor chip with a sealing resin material including a coupling agent.

17. The method according to claim 12, further comprising: applying a coupling agent on the second resin layer; and
 sealing the semiconductor chip with a sealing resin material.

18. The method according to claim 12, wherein the content of the coupling agent is at most 10 wt %.

19. The method according to claim 12, wherein the content of the surfactant is at least 1 ppm and at most 5000 ppm.

20. The method according to claim 12, wherein the sealing resin layer includes inorganic particles.

* * * * *